United States Patent [19]

Hallford

[11] 4,359,781
[45] Nov. 16, 1982

[54] BALUN COUPLED MICROWAVE FREQUENCY CONVERTER WITH SINGLE PAIR OF DIODES

[75] Inventor: Ben R. Hallford, Wylie, Tex.

[73] Assignee: Rockwell International Corporation, El Segundo, Calif.

[21] Appl. No.: 216,718

[22] Filed: Dec. 15, 1980

[51] Int. Cl.³ .............................................. H04B 1/26
[52] U.S. Cl. .................................... 455/327; 455/330; 333/26
[58] Field of Search .............................. 455/225–228, 455/330, 332; 333/26

[56] References Cited

U.S. PATENT DOCUMENTS

| | | | |
|---|---|---|---|
| 3,584,306 | 6/1971 | Spacek | 455/325 |
| 3,735,267 | 5/1973 | Napoli | 455/327 |
| 3,939,430 | 2/1976 | Dickens et al. | 455/327 |
| 4,186,352 | 1/1980 | Hallford | 455/327 |

*Primary Examiner*—Jin F. Ng

*Attorney, Agent, or Firm*—Bruce C. Lutz; Howard R. Greenberg; H. Fredrick Hamann

[57] ABSTRACT

A balun coupled microwave frequency converter is provided by a mixer using a single diode pair with one port balanced and the other port unbalanced. The balanced port is provided by first and second coplanar conductors extending toward a common area and juxtaposed in spaced parallel relation with a transmission line interacting therewith to couple a field balanced between the first and second conductors across the common area. The unbalanced port to the mixer is provided by a third conductor. The diode pair is connected in series between the first and second conductors, and a point between the diodes is connected to the third conductor. One implementation is an up converter with an LO and an IF signal applied on the third conductor and input to the mixer to generate an RF signal between the first and second conductors and hence an induced output RF signal on the transmission line.

20 Claims, 5 Drawing Figures

BALUN COUPLED MICROWAVE FREQUENCY CONVERTER WITH SINGLE PAIR OF DIODES

TECHNICAL FIELD

The invention relates to microwave diode mixers and associated circuitry for up or down conversion between high frequency signals (e.g., RF or LO in the 6 GHz range) and low frequency signals (e.g., IF in the 70 MHz range).

BACKGROUND

Microwave diode mixers are well known in the art. The mixer has a port for carrying an RF signal, a port for carrying an LO signal, and a port for carrying an IF signal which is the difference between the RF and LO signal frequencies. In a down converter, the mixer receives RF and LO signals and outputs the IF signal. In an up converter, the mixer receives the IF signal and the LO signal, and outputs the RF signal. The frequencies which are output from the mixer are the modulation products which exist according to the heterodyne principle by which the mixer operates, wherein a pair of signals are applied to a nonlinear element such as a diode.

SUMMARY

The present invention provides an improved microwave frequency converter. A mixer having a single pair of diodes is provided and affords microwave frequency conversion with mutual signal isolation over a broad frequency range.

One side of the mixer has a balanced port with first and second coplanar spaced strip conductors balun coupled with a transmission line. The other side of the mixer has an unbalanced port with a third strip conductor. The first and second conductors extend from a ground plane toward a common area across which the balanced field therebetween exists. The diode pair is connected in series between connection points on the first and second conductors across the common area, and a connection link connects a point between the diodes to the third conductor. The connection points on the first and second conductors are at substantially the same potential reference level relative to signals on the third conductor such that no net potential is induced between the first and second conductors from the third conductor, whereby to provide signal isolation.

In one particularly desirable implementation, the invention provides an up converter with an IF and an LO signal applied to the third conductor to generate an RF signal between said first and second conductors and hence an output RF signal on the transmission line juxtaposed thereto.

DETAILED DESCRIPTION

Figure 1:
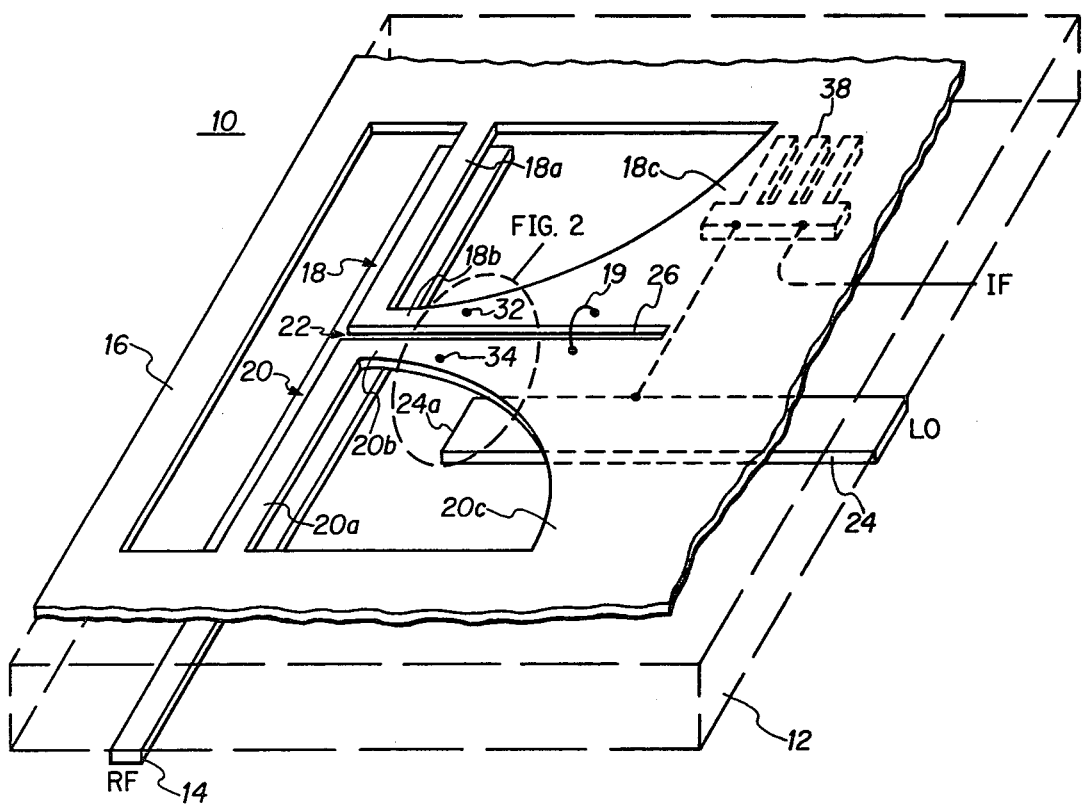
FIG. 1 is an isometric illustration of the microstrip circuit layout of a converter constructed in accordance with the invention.

FIG. 1 shows a balun coupled double balanced microwave frequency converter 10 constructed in accordance with the invention. A microstrip transmission line 14 is on the bottom surface of a dielectric material planar substrate 12 of low relative dielectric constant of about 2 to 5. A ground plane 16 is provided on the top surface of substrate 12. First and second coplanar microstrip conductors 18 and 20 are on the top surface of the substrate. Transmission line 14 is juxtaposed the first and second conductors 18 and 20 for interacting therewith to balun couple an RF field balanced between conductors 18 and 20.

First and second conductors 18 and 20 extend from ground plane 16 toward a common area 22. These conductors have first portions 18a and 20a extending toward each other and second extension portions 18b and 20b extending in spaced parallel relation to define common area 22 as a gap therebetween. These conductors have further extensions 18c and 20c which are flared to merge with ground plane 16.

A microstrip conductor 24 is on the bottom surface of substrate 12 and extends below in spaced parallel juxtaposed relation with gap 26 in the top ground plane 16, which gap 26 is the extension of gap or common area 22. Conductor 24 carries LO signals and is unbalanced, i.e., the field around conductor 24 is referenced to ground at ground plane 16.

Figure 2:
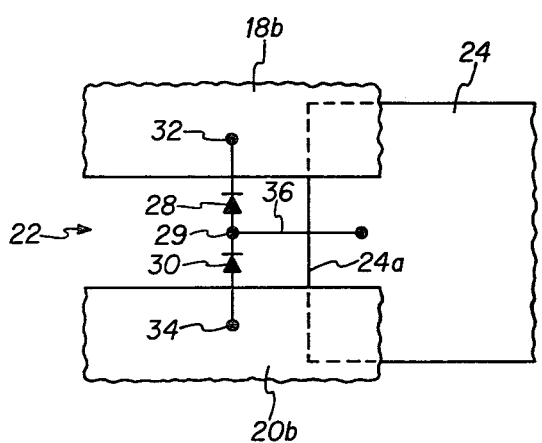
FIG. 2 is a schematic illustration of a portion of FIG. 1.

Referring to FIGS. 1 and 2, a pair of diodes 28 and 30 are connected in series between connection point 32 on conductor portion 18b and connection point 34 on conductor portion 20b. The LO conductor 24 terminates at its end 24a adjacent common area 22. A conductive lead 36 extends from a point 29 between the diodes to conductor 24.

Figure 3:
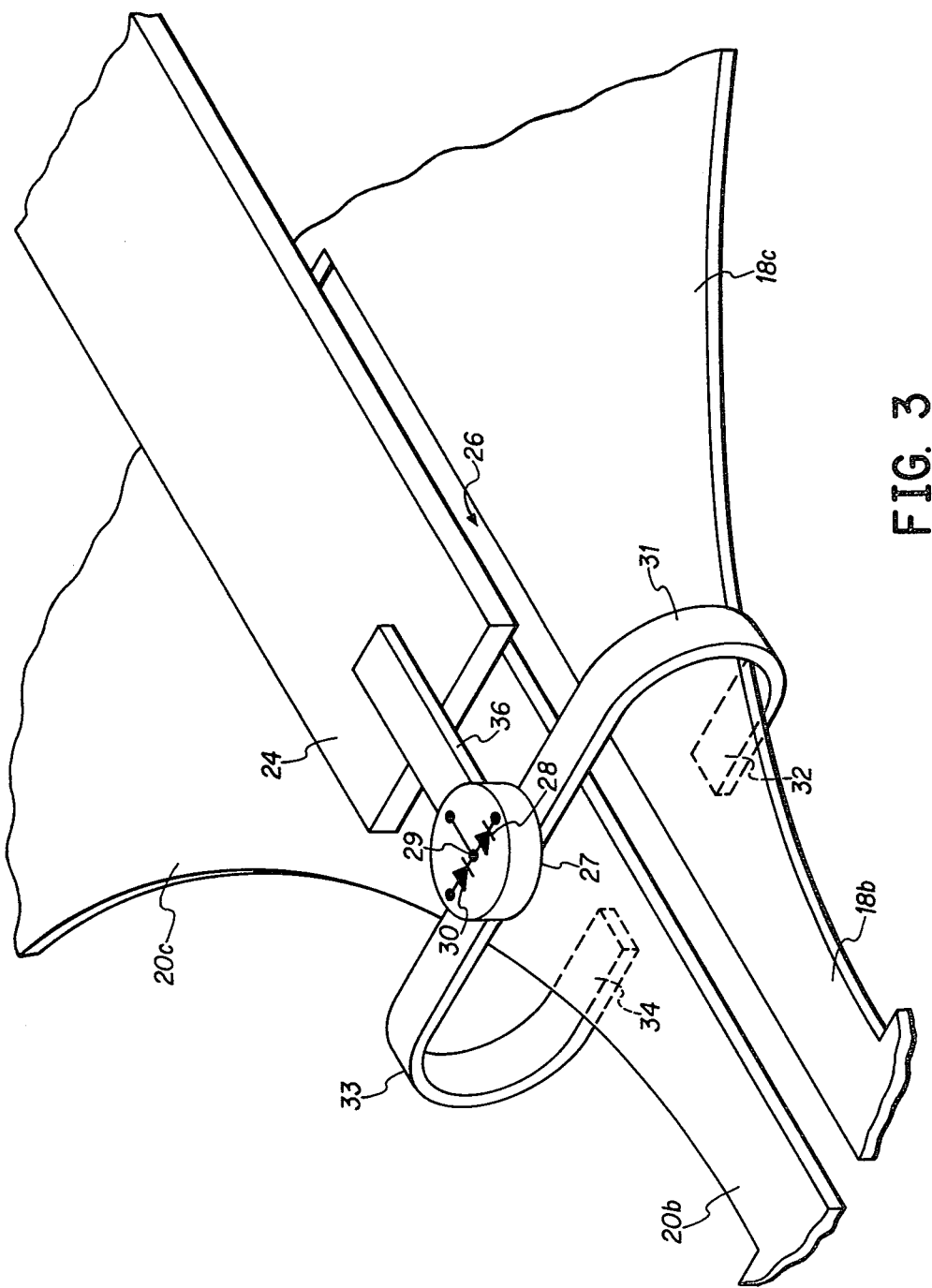
FIG. 3 is an isometric bottom view of the preferred structural connection in FIG. 1 of the diode pair schematically shown in FIG. 2.

FIG. 3 is an isometric bottom view of the preferred structural connection of the diode pair schematically illustrated in FIG. 2. A packaged diode pair is mounted on the bottom of the substrate. The package 27 has conductive lead 36 soldered to conductor 24 such the latter is electrically connected to point 29 between diodes 28 and 30. Conductive lead 31 extends from the cathode of diode 28 up through the substrate and is looped around and soldered on top of conductor 18b at connection point 32. Conductive lead 33 extends from the anode of diode 30 up through the substrate and is looped around and soldered on top of conductor 20b at connection point 34. The diode pair may alternatively be mounted on top of the substrate, with conductive lead 36 extending down through the substrate to conductor 24.

When converter 10 is implemented as a down converter, the diode pair mixes the RF signal on first and second conductors 18 and 20 with the LO signal on third conductor 24 to generate an IF signal. An IF bandpass filter 38 is on the bottom surface of substrate 12 and is connected to third conductor 24. This filter is an RF suppression filter rejecting RF signals but allowing IF signals to pass therethrough, an example of which is described in my U.S. Pat. No. 3,678,433.

When converter 10 is implemented as an up converter, the diode pair mixes an input LO signal on conductor 24 with an input IF signal on conductor 24. This results in heterodyne modulation product signal generation by the mixer, including an RF signal on conductors 18 and 20 and hence an induced output RF signal on conductor 14.

The invention provides isolation between the RF signal on conductors 18 and 20 and the LO signal on conductor 24. The LO signal on conductor 24 is isolated from the RF signal between conductors 18 and 20 because of the low impedance, effective grounds provided by connection points 32 and 34. The LO signal on conductor 24 sees a low impedance, effective ground at each of points 34 and 32, whereby to add the same effective voltage to each in parallel, resulting in no change of the net voltage difference between points 34 and 32. Connection points 32 and 34 are at substantially the same potential reference level relative to LO signals on conductor 24 such that no net potential is induced between conductors 18 and 20 from the third conductor 24, i.e., conductor 24 sees the same potential drop to each of conductors 18 and 20 and thus does not induce any new or additional net potential therebetween. A conductive jumper strap 19 may be provided across gap 26 between conductors 18 and 20 to further insure that the two sides of gap 26 are at substantially the same reference level relative to LO signals on conductor 24.

The RF signal on balanced connection points 32 and 34 due to the induced field therebetween from transmission line 14 is isolated from conductor 24. The RF signals from connection point 34 flows through diode 30 and then diode 28 to connection point 32. Since RF conductor points 34 and 32 are balanced, they are each other's reference points, and hence the voltage on connection point 34 is referenced to connection point 32, not to ground as is the voltage on unbalanced conductor 24. The RF signal from connection point 34 flows through diode 30 to point 29, and then through diode 28 away from point 29, such that conductor 24 sees opposite polarities (voltages which are 180° out of phase), and hence no net voltage is induced on conductor 24.

In FIG. 1, the length of conductor portions 18a and 20a is preferably one-quarter wavelength of the RF frequency. The preferred length of gap 26 from point 32 to the closed end of the gap is one-quarter wavelength of the RF frequency. The width of gap 22 is approximately 40 mils. As above noted, the substrate has a low dielectric constant of about 2 to 5.

Though not a constraint of the invention, the above parameters are significant, particularly the gapwidth and dielectric constant. The invention enables strip transmission on the substrate, as opposed to slotline transmission. The latter suffers various disadvantages and undesirable characteristics, including various constraints on the dimensions of the slot, minimum ground plane spacing on either side of the slot, the requisite high dielectric constant substrate, transmission mode waveguide problems, etc.

For example, in slotline transmission the width of the slot should usually be no greater than 5 to 10 mils. A dielectric substrate having a high magnitude of relative dielectric constant of 9 to 10 or greater is needed. If the slotline is to be generally useful as a transmission line, the fields must be closely confined to the slot. Close confinement can be achieved with slots of realistic dimensions by using a fairly high dielectric constant substrate. If the guide wavelength is roughly 30% to 40% of the free space wavelength, the fields will be adequately confined. Low dielectric constant substrates, for example less than about 8, are typically not suitable for slotline application because the energy is not well confined to the slot. A further drawback of slotline transmission is that specialized and expensive fabrication techniques are required, such as a thin film operation depositing gold on ceramic.

In a particularly desirable aspect of the invention, standard printed circuit board techniques may be used for fabrication, resulting in significant cost reduction. A simple off-the-shelf dielectric substrate which is copper clad on both sides is used. The copper is merely etched away to yield the microstrip pattern shown.

As above noted, an up converter is provided by the circuit of FIG. 1 when IF and LO signals are input to conductor 24. This generates RF signal outputs on transmission line 14. Inputting an IF signal and an RF signal to conductor 24 generates two sideband signals on transmission line 14. A down converter is provided by the circuit of FIG. 1 when an RF signal is input on transmission line 14 and an LO signal is input on conductor 24. This generates an IF signal output through filter 38. Inputting an LO signal to transmission line 14 and an RF signal to conductor 24 also generates an IF signal output from filter 38.

Figure 4:
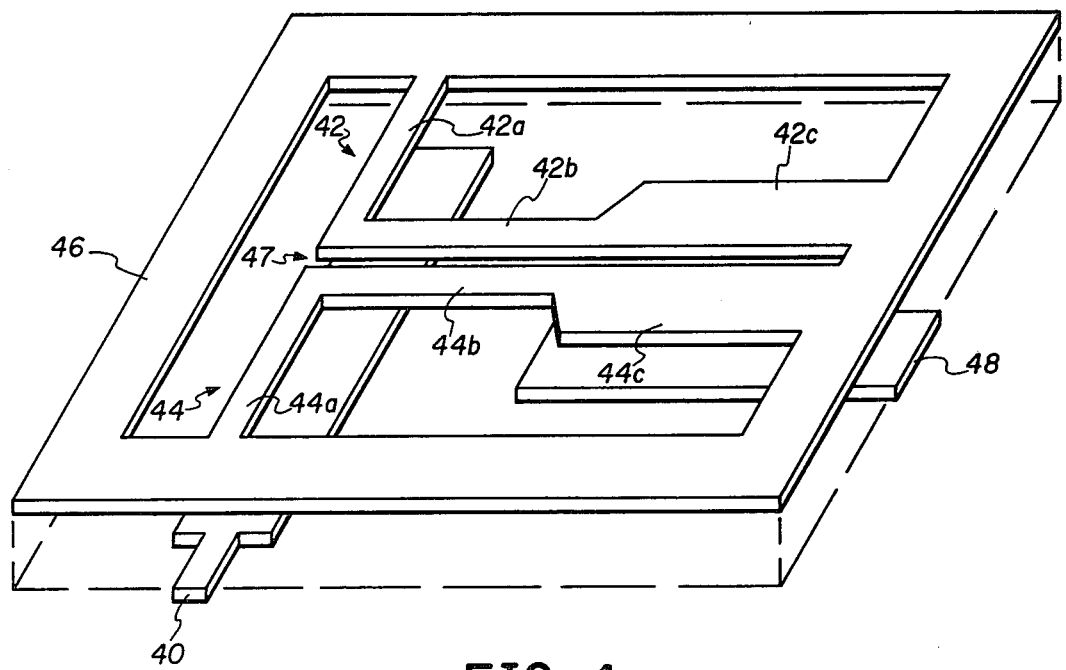
FIG. 4 is an isometric illustration of an alternate embodiment of a portion of the microstrip circuit layout of FIG. 1.

In FIG. 4 input transmission line 40, corresponding to conductor 14 of FIG. 1, couples an RF signal to first and second coplanar strip conductors 42 and 44, corresponding to conductors 18 and 20 of FIG. 1. Transmission line 40 extends beneath ground plane 46 and is spaced therefrom by a substrate (not shown) of low relative dielectric constant of 2 to 5. Conductors 42 and 44 have first portions 42a and 44a extending from ground plane 46 towards each other and have second extensions portions 42b and 44b extending in spaced parallel relation defining a gap of common area 47 therebetween. These conductors have widened stubs 42c and 44c extending to the ground plane 46.

Conductor 48 is coplanar with transmission line 40 and extends beneath ground plane 46 and is spaced therefrom by the dielectric substrate. Microstrip conductor 48 extends below in spaced parallel juxtaposed relation with conductor portions 42b and 44b and gap 47. This gap has a width of about 40 mils. A single diode pair is connected between first and second conductors 42 and 44 and third conductor 48 comparably to FIG. 3 for first and second conductors 18 and 20 and third conductor 24.

Figure 5:
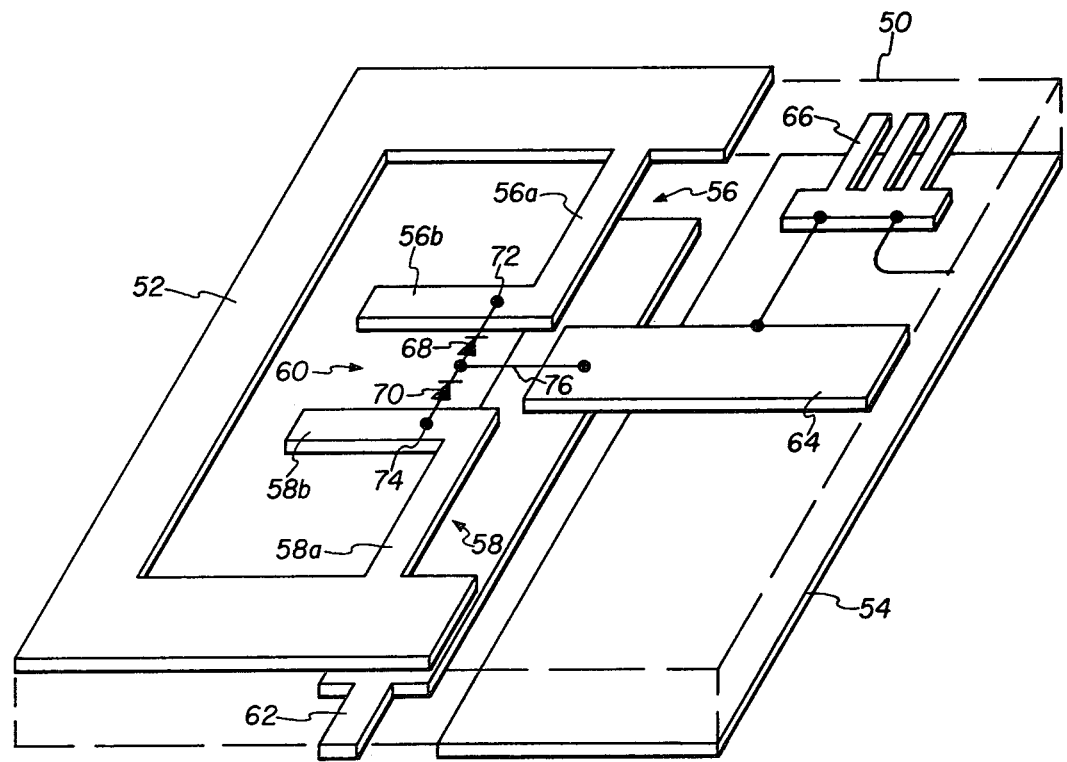
FIG. 5 is an isometric illustration of another alternate embodiment of the microstrip layout of a converter constructed in accordance with the invention.

In FIG. 5, a dielectric substrate 50 of low relative dielectric constant of 2 to 5 has a U-shaped ground plane 52 on its top surface, and a ground plane 54 on its bottom surface. First and second strip conductors 56 and 58 extend from ground plane 52 toward a common area 60. These conductors have first portions 56a and 58a of one-quarter RF wavelength extending towards each other, and second extension portions 56b and 58b extending in spaced parallel relation defining common area 60 as a gap therebetween. This gap has a width of about 40 mils. Extensions 56b and 58b are one-quarter RF wavelength open-circuited stubs whose ends are not connected to ground plane 52. Transmission line 62 is on the bottom surface of substrate 50 and extends below in juxtaposed spaced parallel relation with conductor portions 56a and 58a to couple an RF field therebetween.

An LO microstrip conductor 64 is on the top surface of substrate 50 and extends toward and terminates adjacent common area 60. Conductor 64 is unbalanced, with its ground reference to ground plane 54. An IF bandpass filter 66 is on the top surface of substrate 50 and connected to conductor 64.

A single diode pair 68 and 70 is connected in series between connection point 72 on conductor 56 and connection point 74 on conductor 58. Conductive lead 76 connects a point between the diodes to conductor 64. A balanced RF field exists between connection points 74 and 72 across common gap area 60. As in FIG. 1, the circuit of FIG. 5 provides a balanced input side to the mixer from first and second conductors 56 and 58, and an unbalanced input side to the mixer from third conductor 64.

The circuit of FIG. 5 also provides signal isolation. The LO signal on conductor 64 sees a low impedance, effective ground at each of points 72 and 74 due to one-quarter wavelength open stubs 56b and 58b, whereby to add the same effective voltage to each in parallel, resulting in no change of net voltage difference between points 74 and 72. The reverse isolation is as above described for FIG. 1. The remaining above-described features of FIGS. 1 and 4 are likewise applicable to FIG. 5.

It is recognized that various modifications are possible within the scope of the appended claims.

I claim:

1. A balun coupled frequency converter comprising, in combination:
   first and second coplanar conductors;
   a transmission line situated adjacent said first and second conductors for at least a portion of the length of each of said first and second conductors for interacting therewith to electromagnetically balun couple a field therebetween;
   a third conductor; and
   diode mixer means having a simple pair of diodes interconnecting said first, second and third conductors for heterodyne modulation product signal generation.

2. A balun coupled frequency converter having a diode pair mixer comprising, in combination:
   first and second balanced conductors extending toward a common area;
   a transmission line situated adjacent said first and second conductors for at least a portion of the length of each of said first and second conductors for interacting therewith to electromagnetically balun couple a field balanced between said first and second conductors across said common area;
   a third conductor adjacent said common area; and
   diode mixer means having a single pair of diodes interconnecting said first, second and third conductors for heterodyne modulation product signal generation.

3. A balun coupled frequency converter comprising, in combination:
   ground plane means;
   first and second conductors extending from said ground plane means toward a common area;
   a transmission line situated adjacent said first and second conductors for at least a portion of the length of each of said first and second conductors for interacting therewith to electromagnetically balun couple a field between said first and second conductors across said common area;
   a third conductor adjacent said common area; and
   diode mixer means having a single pair of diodes interconnecting said first, second and third conductors for heterodyne modulation product signal generation and isolating signal on said first and second conductors from signals on said third conductor.

4. The invention according to claim 3 wherein:
   said third conductor is unbalanced;
   said diodes are connected in series between a point on each of said first and second conductors, and include a conductive lead from a point between said diodes to said third conductor; and
   said points on said first and second conductors are at substantially the same potential reference level relative to signals on said third conductor such that no net potential is induced between said first and second conductors from said third conductor such that signals on said third conductor are isolated from said first and second conductors.

5. The invention according to claim 4 wherein said first and second conductors have first portions extending toward each other from said ground plane means and second extension portions extending in spaced parallel relation to said points and defining said common area as a gap therebetween.

6. The invention according to claim 5 wherein said gap extends beyond said connection points, and wherein said third conductor extends in spaced parallel juxtaposed relation with said last mentioned section of said gap and terminates near said points.

7. The invention according to claim 6 wherein said second extension portions of said first and second conductors extend beyond said points and are flared to merge with said ground plane means.

8. The invention according to claim 7 wherein said third conductor and said transmission line are coplanar.

9. The invention according to claim 6 wherein said second extension portions of said first and second conductors extend beyond said points and have widened stubs extending to said ground plane means.

10. The invention according to claim 9 wherein said third conductor and said transmission line are coplanar.

11. The invention according to claim 4 wherein said first and second conductors have first portions extending toward each other from said ground plane means to said points to define said common area as a gap therebetween.

12. The invention according to claim 11 wherein said third conductor is coplanar with said first and second conductors and extends toward and terminates adjacent said gap.

13. The invention according to claim 12 wherein said first and second conductors have stubs extending away from said points on the opposite side thereof from said third conductor to open-circuited ends nonconnected to said ground plane means.

14. A balun coupled frequency converter comprising, in combination:
   a planar dielectric substrate;
   ground plane means on said substrate;
   first and second conductors on one side of said substrate extending from said ground plane means toward a common area;
   a transmission line on the other side of said substrate situated adjacent said first and second conductors for at least a portion of the length of each of said first and second conductors for electromagnetically interacting therewith to balun couple a field balanced between said first and second conductors across said common area;
   a third unbalanced conductor on said substrate adjacent said common area; and diode mixer means having a pair of diodes interconnecting said first, second and third conductors for heterodyne modulation product signal generation.

15. The invention according to claim 14 wherein said third conductor is on said other side of said substrate and has a ground reference to said ground plane means on said one side of said substrate.

16. The invention according to claim 14 wherein said ground plane means has one portion on said one side of said substrate and another portion on said other side of said substrate, and wherein said third conductor is on said one side of said substrate with a ground reference to said other portion of said ground plane means.

17. A balun coupled frequency converter comprising, in combination:
- a dielectric substrate of low relative dielectric constant substantially less than 9;
- ground plane means on said substrate;
- first and second conductors on said substrate extending from said ground plane means toward a common area;
- a transmission line on said substrate situated adjacent said first and second conductors for at least a portion of the length of each of said first and second conductors for interacting therewith to electromagnetically balun couple a field balanced between said first and second conductors across said common area;
- a third conductor on said substrate adjacent said common area; and
- diode mixer means having a pair of diodes interconnecting said first, second and third conductors for heterodyne modulation product signal generation.

18. The invention according to claim 17 wherein said first and second conductors are spaced by a gap across said common area of width substantially greater than 10 mils.

19. The invention according to claim 18 wherein said converter is fabricated on a printed circuit board comprising a metal clad dielectric substrate etched to provide a microstrip pattern forming said ground plane means, said first, second and third conductors, and said transmission line.

20. The invention according to claim 19 wherein said gap width is about 40 mils, and said relative dielectric constant is about 2 to 5.

* * * * *